United States Patent [19]
Calderon

[11] 4,119,881
[45] Oct. 10, 1978

[54] ION BEAM GENERATOR HAVING CONCENTRICALLY ARRANGED FRUSTOCONICAL ACCELERATING GRIDS

[75] Inventor: Arthur Calderon, Minnetonka, Minn.

[73] Assignee: Control Data Corporation, Minneapolis, Minn.

[21] Appl. No.: 881,273

[22] Filed: Feb. 27, 1978

[51] Int. Cl.² ............................................. H05H 5/02
[52] U.S. Cl. ................................. 313/360; 250/423 R; 313/349; 313/361
[58] Field of Search ............... 313/360, 361, 348, 349; 315/111.8; 250/423, 426

[56] References Cited

U.S. PATENT DOCUMENTS

| | | | |
|---|---|---|---|
| 2,651,000 | 9/1953 | Linder | 313/349 X |
| 2,785,311 | 3/1957 | Lawrence | 250/426 |
| 2,975,277 | 3/1961 | Von Ardenne | 315/111.8 X |

Primary Examiner—Palmer C. Demeo
Attorney, Agent, or Firm—Robert M. Angus

[57] ABSTRACT

A grid system for an ion beam generator is provided having a frustoconical shape so that the collimated ion beam converges at a predetermined angle toward the target to provide selective beveled etching.

8 Claims, 8 Drawing Figures

ION BEAM GENERATOR HAVING CONCENTRICALLY ARRANGED FRUSTOCONICAL ACCELERATING GRIDS

This invention relates to ion beam generation, and particularly to the generation of ion beams for use in etching operations, such as in the production of microcircuits.

Selective etching of materials may be accomplished through the use of ion beams. It is well known, for example, that an accelerated ion beam directed at a material through a suitable mask, is capable of selective etching that material to form microcircuits, and the like. Prior etching techniques employing ion beams have utilized a collimated ion beam directed normal to the surface of the material to be etched. Such a technique provided a very sharp definition to the selective etch in the material which, for some cases, has been found highly desirable. However, it has been found that if the etched material is to be subsequently coated (after etching), microscopic faults or flaws may form in the coated layer adjacent the sharp edges formed by the etching process. While the cause of such flaws is not fully known, it is theorized that internal stresses in the coating material during condensation of the coating material cause the coating material to crack and even fail in some cases. Accordingly, in cases where the etched material is to be subsequently coated, it has been found desirable to etch the material in such a way as to form a chamfer or beveled surface to which the coating material may adhere.

To accomplish the beveled or chamfered edge of the etch, is has been the practice to tilt the substrate table in relationship to the ion beam so that the ion beam impinges the substrate and material to be etched at a predetermined angle. The substrate table is rotated to obtain an even impingement of ions against the material to be etched from all directions at the desired angle. However, local heat concentrations occurring during the etching process renders it mandatory that the substrate be adequately cooled as it is being rotated on the substrate table.

The present invention is concerned with apparatus for selectively directing an ion beam at a substrate from a plurality of directions, all at a predetermined angle from the surface of the material to be etched.

Particularly, the present invention concerns a grid network for accelerating ion beams in such a manner as to simultaneously bombard a target at a predetermined angle from a plurality of directions.

In accordance with the present invention, an ion beam grid network is provided having a substantially frustoconical shape with the beam generated by the grid being directed to the interior of the cone at an angle dependent upon the angle of the cone.

One feature of the present invention resides in the provision of a grid network for ion beam generation capable of generating an ion beam for bombarding a target at a predetermined angle and from a plurality of directions.

Another feature of the present invention resides in the provision of an ion beam generator for selectively etching a material to obtain a beveled or chamfered edge to the etched surface thereby rendering the material suitable for subsequent coating.

The above and other features of this invention will be more fully understood from the following detailed description, and the accompanying drawings, in which.

Figure 4:
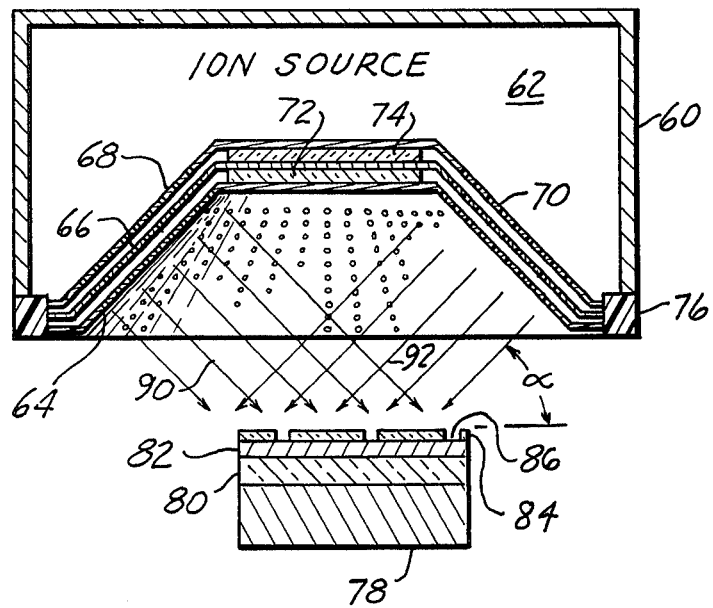
Figure 5A:
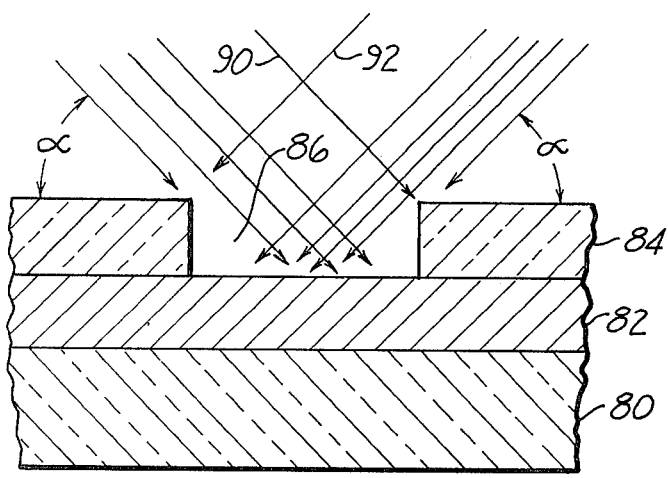
Figure 5B:
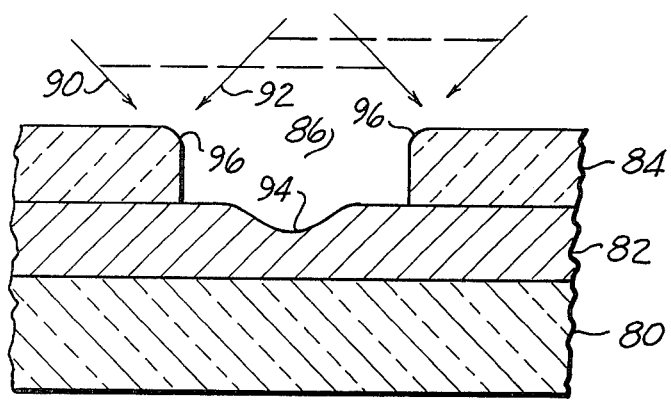
Figure 5C:
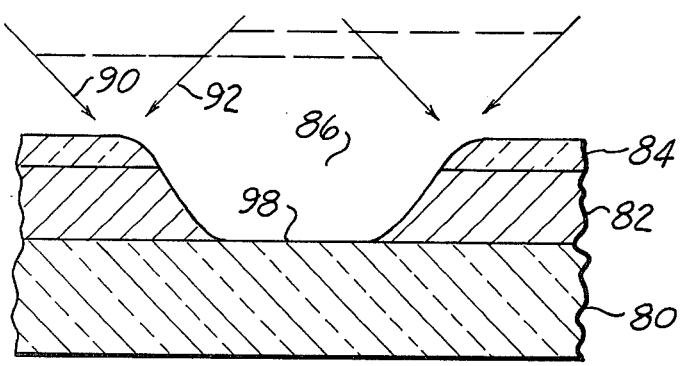
Figure 5D:
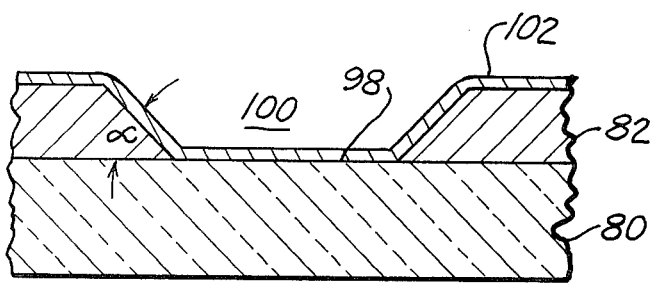

FIG. 4 illustrates the ion beam generation techniques in accordance with the presently preferred embodiment of the present invention, showing the ion beam grid system in accordance with the present invention in greater detail; and FIGS. 5A through 5D illustrate various steps of the etching process accomplished by the ion beam generation techniques in accordance with the present invention, FIG. 5D particularly illustrating a finished coated product.

Figure 1:
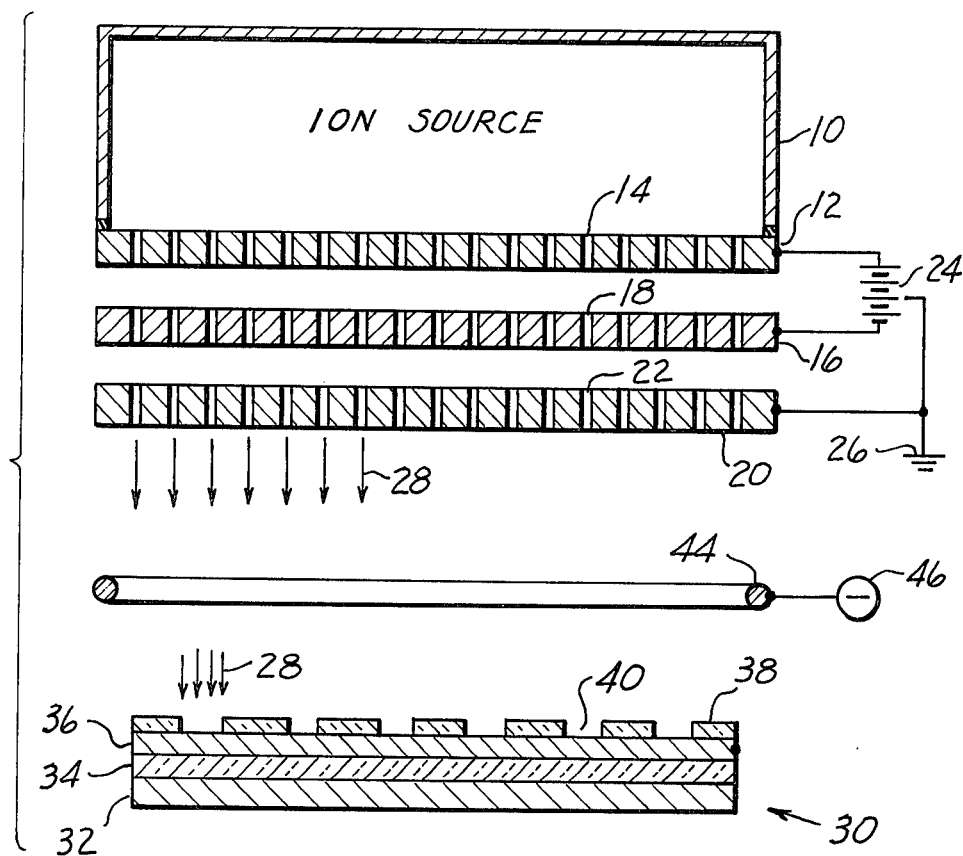
FIG. 1 is a schematic representation of a typical ion beam generator for selective etching purposes in accordance with the prior art.

With reference to the drawings, particularly to FIG. 1 which illustrates a typical ion beam generation scheme in accordance with a prior art, there is illustrated an ion source 10 containing a suitable source of ions, such as argon gas which has been ionized. Source 10 might, for example, comprise a chamber containing ionized argon gas. One end of source 10 is closed by a flat grid 12 having suitable apertures 14 disposed therein. Grid 16 may be included, spaced a short distance from grid 12 and includes apertures 18 directly in line with apertures 14 of grid 12. Grid 20 is included, spaced a short distance from grid 16 and containing apertures 22 also in line with apertures 14 and 18. Typically, a source of potential 24 is provided to charge grid 12 to a high positive potential and to maintain grid 20 at ground, as shown at 26. If grid 16 is employed, it will be negatively charged, as shown. Grids 12, 16 and 20, together with their aligned apertures 14, 18 and 22, serve to extract ions from ion source 10, collimate the ions, and accelerate the ions to a kinetic energy of up to about 1,000 electron volts. Further, the presence of the high negative grid 16 serves to retard electrons from the ion source. The ion beam 28 is thus a collimated ion beam directed at the target illustrated generally at 30.

Target 30 ordinarily includes a grounded substrate table 32 supporting a suitable substrate 34. A material to be etched, such as metal layer 36 is supported or adhered to substrate 34 and a suitable mask 38 having apertures 40 is formed over layer 36. Typically, mask 38 may comprise a suitable photo resist which has been exposed and developed to form the apertures 40. If layer 36 is an insulative material, a suitable "hot filament" 44 may be disposed in close relationship to the target and connected to a suitable potential 46, which is adequately grounded. Filament 44 may, for example, comprise a loop of wire surrounding the region of the target 30 so as to provide electrons for neutralizing any positive surface charge accumulation on the target.

The apparatus illustrated in FIG. 1 is useful for generating a collimated ion beam 28 which impinges material 36 through the openings 40 and mask 38. Since the beam is highly collimated, the edges 48 of the etch are quite sharply defined. However, if the target is to be subsequently coated with a layer 50, the sharp corners 52 formed by the etching process create stress in the coating material 50 during solidification or curing thereof to form cracks and microscopic faults 54 at the corners. The sharp corners may also cause thin spots 55 in the coating material which might also lead to fractures due to electromigration at high current densities. In certain applications, particularly in the production of microcircuits, such faults may not be tolerable. Hence, it is desirable to form a more beveled etched surface in material 36 for better adhesion by the coating layer. Thus, it is desirable to form an etch generally as illustrated in FIG. 5D.

Figure 3:
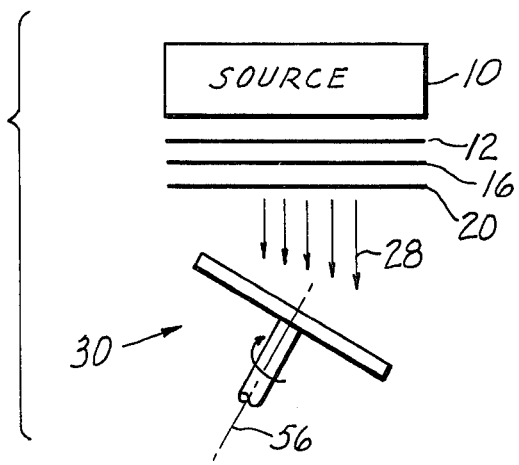
FIG. 3 is an illustration of another ion beam generation technique in accordance with prior techniques.

With reference to FIG. 3, some attempts have been made to form an etch as illustrated in FIG. 5D. This has been accomplished by tilting the target 30 and rotating the same about axis 56 of the substrate table. Thus, it has been possible to cause the beam 28 to bombard the material at a selected angle, dependent upon the angle of tilt of the target, and by rotating the target about axis 56, a beveled edge to the etch was accomplished. However, the technique illustrated in FIG. 3 was not altogether successful because the ion beam and etching process created a significant amount of localized heat which could not be adequately carried away by coolant in the substrate table. The present invention, which is concerned with a particular grid structure for ion beam generation techniques, overcomes the problems associated with the apparatus illustrated in FIG. 3 yet produces the desired etch configuration as shown in FIG. 5D.

With reference to FIG. 4, there is illustrated an ion beam electrode grid assembly in accordance with the presently preferred embodiment of the present invention. As illustrated in FIG. 4, chanber 60 contains a suitable ion source 62, such as positively charged argon gas. A grid assembly consisting of grids 64, 66 and 68 closes one end of vessel 60 and includes a plurality of aligned apertures 70 aligned in such a manner as to collimate ions emitted from source 62. As illustrated in FIG. 4, the grid assembly is arranged in frustoconical shape with the apertures 70 aligned along the conical surfaces of the grid assembly. The region between grids 64 and 66 and between grids 66 and 68 between the conical surfaces of the grid assembly contain suitable insulators 72 and 74 to provide added support for the grid structure. Preferably, the terminous ends of grids 64, 66 and 68 terminate and are held in position by circular insulator 76 with suitable wiring to the grids so that grid 64 is maintained at ground potential, grid 66 is maintained at a highly negative potential and grid 68 is maintained at a highly positive potential. Insulator 76 is removably fastened to housing 60 by suitable fasteners (not shown).

Substrate table 78 is positioned below the grid structure in such a manner as to support substrate 80. Layer 82, which is the layer to be selectively etched, is disposed over substrate 80, and mask 84 containing suitable apertures 86 is disposed over layer 82. As shown in FIG. 4, the conical surface of the grid structure is disposed at a suitable angle α to the surface of the substrate table, angle α being preferably of the order of about 45° although it will be evident to those skilled in the art that the angle may be any suitable angle between about 30° and 60°.

Figure 2:
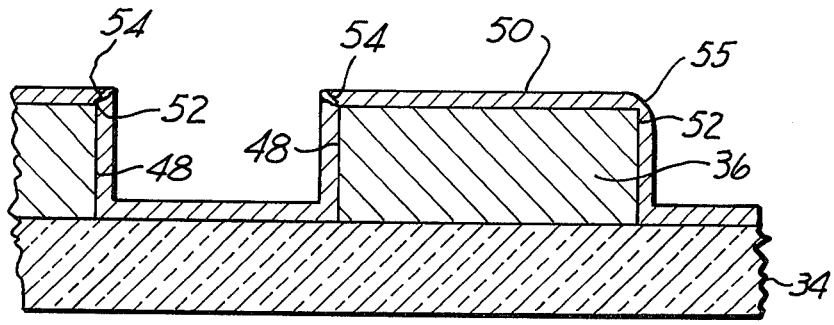
FIG. 2 illustrates a typical etch formation, which has been coated, in accordance with prior techniques, as might be accomplished by the apparatus illustrated in FIG. 1.

FIGS. 5A through 5D, taken together, illustrate the manner by which the selected etching occurs through a suitable aperture 86 in mask 84. The collimated ions are directed at the material to be etched in the form of a convergent beam 90, 92 which impinges mask 84 and the exposed portions of material 82 at angle α. As shown particularly in FIG. 5B, a depression 94 is formed in the center of layer 82 at the approximate midpoint of aperture 86 in mask 84. At the same time, the sharp corners 96 of mask 84 are etched away. As shown in FIG. 5C, the process continues, etching the material 82 to expose surface 98 of substrate 80 and continuing to etch away mask 84. This process continues until the structure illustrated in FIG. 5D is achieved with the material 82 etched to form the completed aperture 100 having sidewalls exposed at angle α. The mask 84 may be removed in a manner well-known in the art. The exposed surfaces of material 82 and surface 98 of material 80 may then be coated as illustrated at 102 without the sharp transition angles, such as shown in FIG. 2. The coating of the surfaces of material 80 and 82 may be accomplished by any suitable technique well-known in the art, such as by a vacuum evaporation or by sputtering techniques.

If material 82 is insulative, an electron emitting "hot filament," such as shown and described in connection with FIG. 1 would be used in close proximity to substrate table 80.

In order to alter the incident angle of the ion beam, separate grid structures, each supported by an insulator 76 and each having a unique conical angle may be provided. Since the incident angle of the ion beam is dependent upon the conical angle of the grid structure, the incident angle may be changed by changing the grid structure. As heretofore mentioned, insulator 76 is preferably fastened to housing 60 to provide ready removal and replacement of the grid structure to accomplish ready change of the incident angle of the ion beam.

The present invention thus provides an ion beam generating apparatus suitable for creating beveled etches useful for etching materials which would thereafter be coated. The invention is effective in operation and provides reliable beveled etching.

This invention is not to be limited by the embodiment shown in the drawings and described in the description, which is given by way of example and not of limitation, but only in accordance with the scope of the appended claims.

What is claimed is:

1. An ion beam generator for generating an ion beam comprising: a source of ions, and a grid arrangement for accelerating ions toward a target in a collimated beam, said grid arrangement comprising a plurality of individual frustoconical grids arranged in a concentric configuration and having apertures through the conical surface of each of said grids, said apertures being aligned normal to the conical surface of said grids so that said ion beam converges and impinges said target at a predetermined angle, said angle being between about 30° and 60°.

2. Apparatus according to claim 1 wherein said grid arrangement comprises at least two individual spaced frustoconical grids arranged in a concentric configuration, the first of said grids being adjacent said source and second of said grids being exposed to the region of said target, and electrical means for charging said first grid positively and for maintaining said second grid at a neutral potential.

3. Apparatus according to claim 2 further including a third grid disposed between said first and second grids and spaced therefrom, said electrical means charging said third grid negatively.

4. Apparatus according to claim 3 further including insulator means between said first and third grids and between said second and third grids, said insulator means spacing said grids apart in the region between said conical surface.

5. In an ion beam generator for propagating a collimated ion beam, the improvement comprising a grid arrangement comprising a plurality of individual frustoconical grids arranged in a concentric configuration and having apertures through the conical surface of each of said grids, said apertures being aligned normal to the conical surface of said grids so that said ion beam coverges at a predetermined angle, said angle being between about 30° and 60°.

6. Apparatus according to claim 5 wherein said grid arrangement comprises at least two individual spaced frustoconical grids arranged in a concentric configuration, the first of said grids being adjacent said source and the second of said grids being exposed to the region of said target, and electrical means for charging said first grid positively and for maintaining said second grid at a neutral potential.

7. Apparatus according to claim 6 further indicating a third grid disposed between said first and second grids and spaced therefrom, said electrical means charging said third grid negatively.

8. Apparatus according to claim 7 further including insulator means between said first and third grids and between said second and third grids, said insulator means spacing said grids apart in the region between said conical surface.

* * * * *